(12) United States Patent
Kwon (10) Patent No.: US 8,618,842 B2
(45) Date of Patent: Dec. 31, 2013

(54) DIFFERENTIAL PVT/TIMING-SKEW-TOLERANT SELF-CORRECTING CIRCUITS

(75) Inventor: Chang Ki Kwon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 116 days.

(21) Appl. No.: 13/249,285

(22) Filed: Sep. 30, 2011

(65) Prior Publication Data

US 2013/0082769 A1  Apr. 4, 2013

(51) Int. Cl.
*H03B 1/00* (2006.01)
*H03K 3/00* (2006.01)

(52) U.S. Cl.
USPC ............................ 327/108; 327/109; 327/111

(58) Field of Classification Search
USPC .......................................... 327/108, 109, 111
See application file for complete search history.

(56) References Cited

U.S. PATENT DOCUMENTS

| | | | |
|---|---|---|---|
| 5,825,215 A * | 10/1998 | Sugio et al. ..................... 327/108 |
| 6,064,230 A | 5/2000 | Singh | |
| 6,288,563 B1 | 9/2001 | Muljono et al. | |
| 6,294,937 B1 | 9/2001 | Crafts et al. | |
| 6,670,838 B1 | 12/2003 | Cao | |
| 6,766,155 B2 | 7/2004 | Salcido et al. | |
| 7,368,976 B2 | 5/2008 | Gupta et al. | |
| 7,378,905 B2 * | 5/2008 | Ferianz et al. ................... 330/69 |
| 2002/0060602 A1 | 5/2002 | Ghia et al. | |
| 2006/0066352 A1 | 3/2006 | Davis et al. | |
| 2008/0054944 A1 | 3/2008 | Kwon | |
| 2008/0136467 A1 * | 6/2008 | Tambouris et al. ........... 327/111 |
| 2008/0204096 A1 * | 8/2008 | Agarwal et al. ............... 327/171 |
| 2010/0225372 A1 | 9/2010 | Satoh et al. | |
| 2011/0140749 A1 * | 6/2011 | Huang .......................... 327/166 |
| 2011/0163789 A1 | 7/2011 | Na et al. | |

OTHER PUBLICATIONS

International Search Report and Written Opinion—PCT/US2012/058175—ISA/EPO—Jan. 25, 2013.

* cited by examiner

*Primary Examiner* — John Poos
(74) *Attorney, Agent, or Firm* — Sam Talpalatsky; Nicholas J. Pauley; Joseph Agusta (57) ABSTRACT

Systems and methods for circuits that self-correct errors due to variations in fabrication processes, voltages, and temperature (PVT), as well as input timing errors. In an exemplary embodiment, a method for improving output signal quality in a complementary logic circuit is provided. An n-type transistor in the complementary logic circuit is digitally enabled or biased with a first variable power supply. A p-type transistor in the complementary logic circuit is digitally enabled or biased with a second variable power supply, providing a voltage different from that of the first variable power supply, to mitigate a difference in the switching times between the p-type transistor and the n-type transistor.

36 Claims, 9 Drawing Sheets

DIFFERENTIAL PVT/TIMING-SKEW-TOLERANT SELF-CORRECTING CIRCUITS

FIELD OF DISCLOSURE

This application relates generally to electronic devices and more specifically, but not exclusively, to improving mixed signal or digital signal performance.

BACKGROUND

Semiconductor production is becoming less centralized as new foundries are being established across the globe. Some effects of the establishment of new foundries include increasing variation in fabrication processes, voltages, and tolerances (PVT) between different foundries, as well as the chip level. Moreover, as the degree of miniaturization, hybridization, and gate count increases, and greater numbers of smaller transistors associated with diverse functions are integrated to increase performance, many sub-circuits are increasingly controlled by different supply voltages and at different frequencies. This results in performance variations chip-to-chip.

The performance variations can be due to global variations in the fabrication process (i.e., large-scale variations) and/or local variations in the fabrication process (i.e., small-scale variations). As an example of a global variation, an in circuit fabricated by one foundry performs differently than the same type of integrated circuit that has been fabricated at a different foundry. As an example of a local variation, two transistors on the same die, having ideally identical dimensions, can perform differently due to variations in doping. The performance variations can affect yield.

In addition to PVT-based performance variations, in conventional devices, a p-type semiconductor device has less current drive due to reduced charge carrier mobility when compared to an n-type semiconductor, given the existing process and the same physical size. In a complementary logic circuit having p-type and n-type semiconductor devices, the reduced charge carrier mobility can result in an asymmetrical output waveform. A common design technique to mitigate this effect is to design the p-type semiconductor device so that the p-type semiconductor device is larger than the associated n-type semiconductor device. The larger p-type semiconductor device requires circuit area.

In the complementary logic circuit, the output waveforms peak-to-peak voltage can also be affected by electrostatic discharge (ESD) components coupled between the complementary logic circuit's power supplies and the complementary logic circuit. Also, the ESD components require circuit area that could be put to a different use.

Further, in conventional complementary logic circuit circuits, rail-to-rail rise time and fall time varies dependent on output current, output impedance, and input/output loading. For example, resistive, inductive, and capacitive input loading can also affect rail-to-rail rise time and fall time, even given the same output loading.

There are long-felt industry needs for self-correcting circuits such as inverters, buffers, level-shifters, oscillators, and the like that mitigate the effects of performance variations. Further, there are long-felt industry needs for complementary logic circuits that, compared to conventional devices, occupy less layout area on an integrated circuit die, have lower power consumption, and have greater timing accuracy. Thus, there are needs to improve upon classic circuit designs and methods.

SUMMARY

Exemplary embodiments of the invention are directed to systems and methods for circuits that self-correct performance variations, such as timing skew, due to variations in fabrication processes, voltages, and temperature (PVT), as well as input timing errors. The exemplary embodiments address the long-felt needs in the industry described herein.

Systems and methods for increasing slew rate in a complementary logic circuit are provided. In an embodiment, a circuit is provided that includes first and second inverters, as well as first and second buffers. The first inverter and the first buffer have a first common input. The second inverter and the second buffer have a second common input. The output of the first inverter is coupled to the output of the second buffer. The output of the second inverter is coupled to the output of the first buffer. The circuit also includes a bias network having both a respective positive bias circuit and a respective negative bias circuit coupled to each inverter, as well as a respective positive bias circuit and a respective negative bias circuit coupled to each buffer.

In another embodiment, a method for improving output signal quality in a complementary logic circuit is provided. An n-type transistor in the complementary logic circuit is biased with a first variable power supply. A p-type transistor in the complementary logic circuit is biased with a second variable power supply, providing a voltage different from that of the first variable power supply, to mitigate a difference in the switching times between the p-type transistor and the n-type transistor.

BRIEF DESCRIPTION OF THE DRAWINGS

The accompanying drawings are presented to aid in the description of embodiments of the invention, and are provided solely for illustration of the embodiments and not limitation thereof.

In accordance with common practice, the various features illustrated in the drawings may not be drawn to scale. Accordingly, the dimensions of the various features may be arbitrarily expanded or reduced for clarity. In addition, some of the drawings may be simplified for clarity. Thus, the drawings

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described, in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of other embodiments of the invention. As used herein, the singular forms "a," "an," and "the" are intended to include the plural forms as well, unless the context clearly indicates otherwise. It will be further understood that the terms "comprises," "comprising," "includes," and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
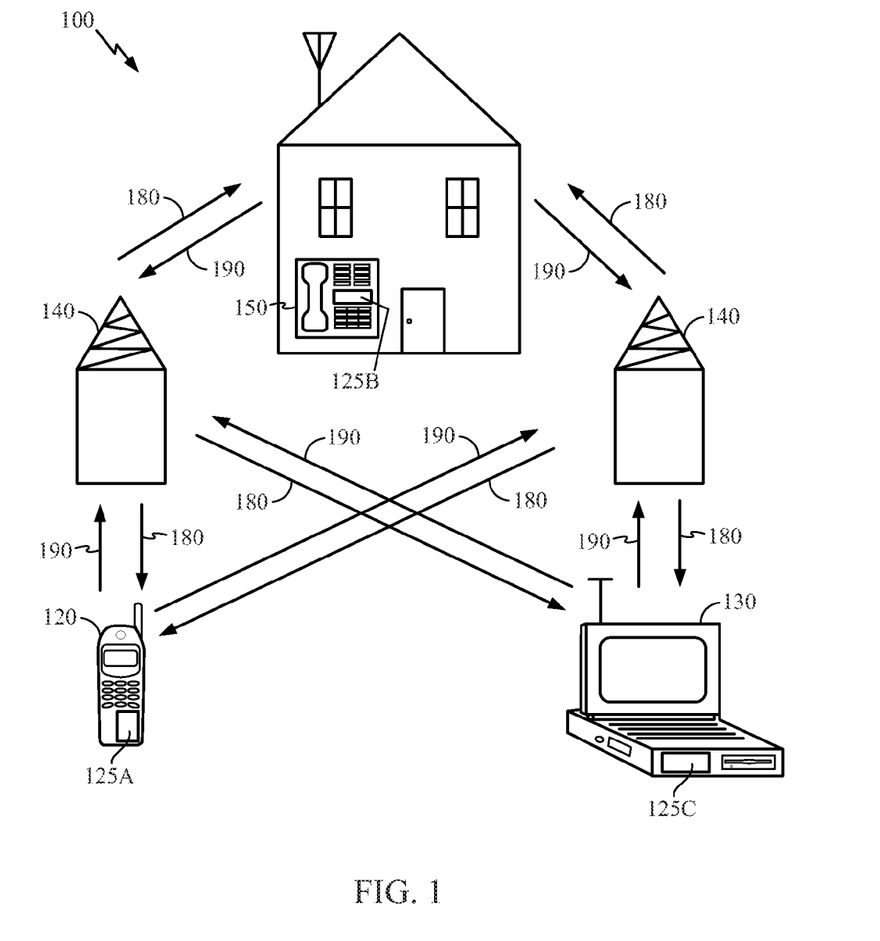
FIG. 1 depicts an exemplary communication device.

FIG. 1 depicts an exemplary communication system 100 in which an embodiment of the disclosure may be advantageously employed. For purposes of illustration, FIG. 1 shows three remote units 120, 130, and 150 and two base stations 140. It will be recognized that conventional wireless communication systems may have many more remote units and base stations. The remote units 120, 130, and 150 include at least a part of an embodiment 125A-C of the disclosure as discussed further below. FIG. 1 shows forward link signals 180 from the base stations 140 and the remote units 120, 130, and 150, as well as reverse link signals 190 from the remote units 120, 130, and 150 to the base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units (e.g., meter reading equipment), or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device.

Figure 2:
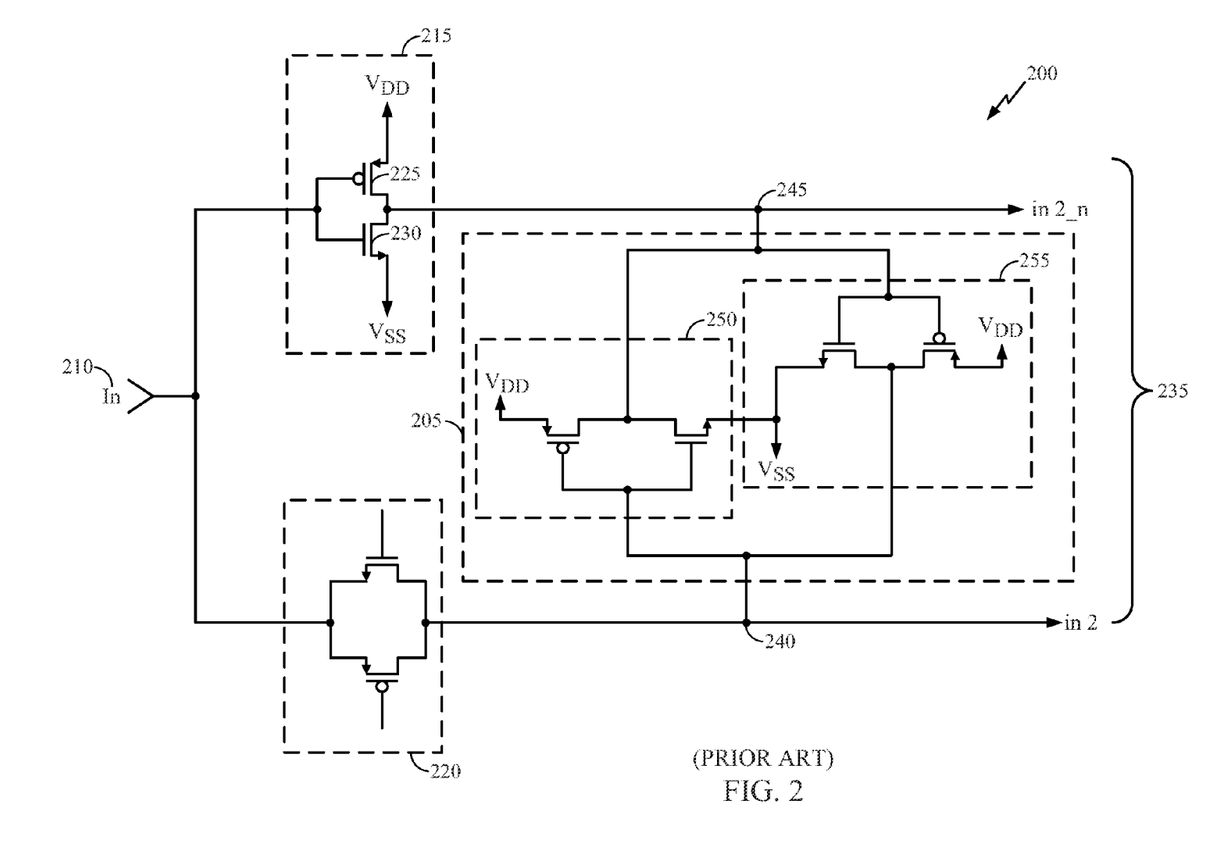
FIG. 2 depicts a conventional inverter/buffer circuit.

FIG. 2 depicts a conventional inverter/buffer circuit 200 having a latching sense amplifier 205. The conventional inverter/buffer circuit 200 has a single-ended input 210 that is split, and input, to an inverter 215 and a buffer 220. The inverter 215 includes a p-type transistor 225 and an n-type transistor 230. The p-type transistor 225 has less current drive due to reduced charge carrier mobility, and thus reacts to changes in the single-ended input 210 slower than the n-type transistor 230. Further both the p-type transistor 225 and the n-type transistor 230 have threshold voltages (Vth) greater than zero, thus the single-ended input 210 must rise to overcome the threshold voltages before the p-type transistor 225 and the n-type transistor 230 start to conduct. Similar effects occur in the buffer 220. As a result, over variations in PVT, the conventional inverter/buffer circuit 200 slew rate, crossing points, and duty-error are not optimal. To mitigate these effects, a latching sense amplifier 205 is coupled across an interstage output 235 (in2, in2_n), which is a complementary output formed by the buffer output 240 and the inverter output 245. The latching sense amplifier 205 includes two inverters 250, 255 that are coupled in parallel, where the input of a first inverter 250 is coupled to the output of the second inverter 255. The latching sense amplifier 205 improves the slew rate, crossing points, and duty-error of the conventional inverter/buffer circuit 200 by sensing when either conductor of the interstage output 235 starts to change, and driving both conductors of the interstage output 235 to change their logic value without waiting for the slower p-type transistor to affect the interstage output 235. The interstage output 235 can optionally be coupled to an input of the circuits depicted in FIGS. 3-5.

Figure 3:
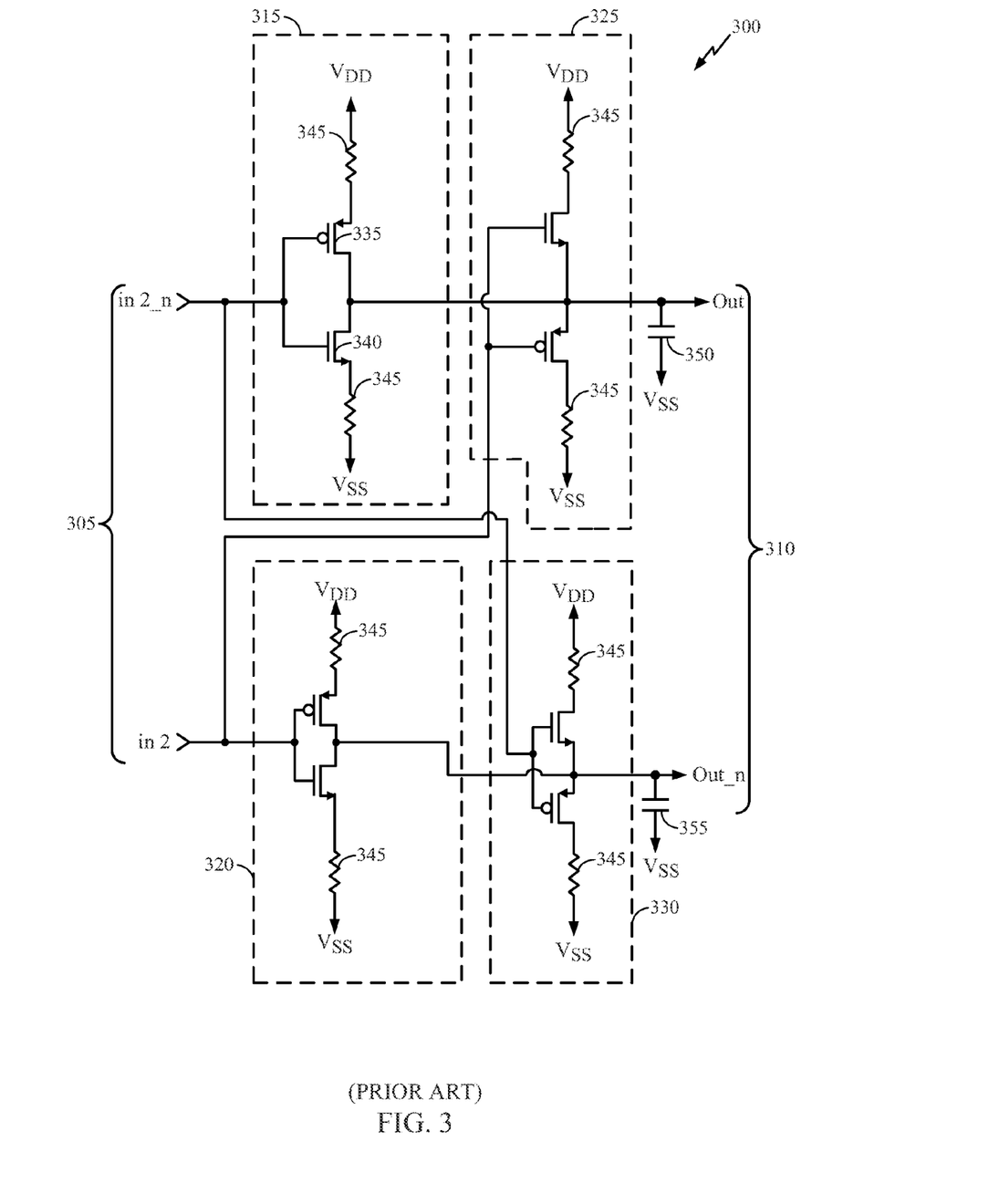
FIG. 3 depicts a conventional differential complementary logic circuit.

FIG. 3 depicts a conventional complementary logic circuit 300. The complementary logic circuit 300 performs both inverting and buffering of a complementary input 305. In an example, the interstage output 235 can optionally be coupled to the complementary input 305. The complementary input 305 is coupled to a complementary output 310 via a first inverter 315 and a second inverter 320, as well as a first buffer 325 and a second buffer 330. The first inverter 315, the second inverter 320, the first buffer 325, and the second buffer 330 include p-type transistors 335 and n-type transistors 340. The first inverter 315, the second inverter 320, the first buffer 325, and the second buffer 330 are coupled to drain and source power supplies (Vss and Vdd) via electrostatic discharge (ESD) protection or latch-up protection resistors 345. Another effect is that the ESD protection and latch-up protection resistors 345 cannot be scaled down.

The first and second inverters 315, 320 are series-coupled between respective conductors in the complementary input 305 and a complementary output 310. The first and second buffers 325 and 330 are cross-coupled between respective conductors in the complementary input 305 and the complementary output 310. This feedforward configuration improves the slew rate, crossing points, and duty-error of the complementary logic circuit 300. The first and second buffers 325 and 330 sense when a logic value of either conductor of the complementary input 305 starts to change, and subsequently drives both conductors of the complementary output 310 to change their logic value, without waiting for slower p-type transistors in the first and second inverters 315, 320 to affect the complementary output 310. The feedforward configuration of the first and second buffers 325 and 330 also mitigates any phase mismatch in the complementary input 305. The complementary output 310 is filtered by a pair of capacitors 350, 355.

Figure 4:
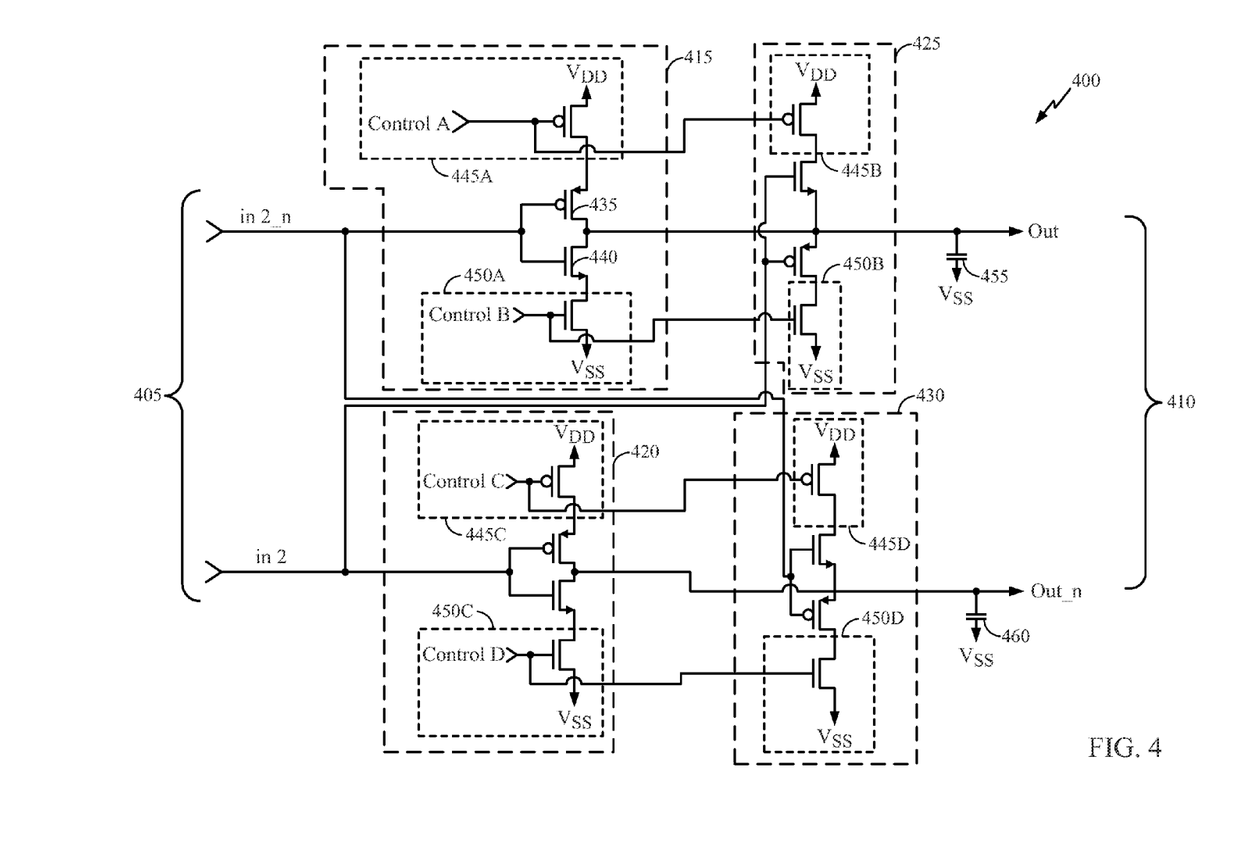
FIG. 4 depicts an exemplary complementary logic circuit having a stacked architecture and separate variable power supplies for p-type semiconductors and n-type semiconductors.

FIG. 4 depicts an exemplary complementary logic circuit 400 having a stacked architecture and separate variable power supplies for p-type semiconductors and n-type semiconductors. The stacked architecture mitigates effects of local variations in the fabrication process. The complementary logic circuit 100 performs both inverting and buffering of a complementary input 405. In an example, the interstage output 235 can optionally be coupled to the complementary input 405. The complementary input 405 is coupled to a complementary output 410 via a first inverter 415 and a second inverter 420, as well as a first buffer 425 and a second buffer 430. The first inverter 415, the second inverter 420, the first buffer 425, and the second buffer 430 include p-type transistors 435 and n-type transistors 440. The inverters 415, 420 and buffers 425, 430 are coupled to the separate drain and source power supplies (Vss and Vdd) via adjustable positive bias circuits 445A-D and adjustable negative bias circuits 450A-D. The adjustable positive bias circuits 415A-D and adjustable negative bias circuits 450A-D are adjustable via Control A-D to match the performance of the p-type transistors 435 and the n-type transistors 440, which mitigates global fabrication variations and to improve the switching times, slew rate, crossing points, and duty-error of the complementary logic circuit 400. In an example, the adjustable positive bias circuits 445A-D can be adjusted independently, or as a group. In a further example, the adjustable negative bias circuits 450A-D can be adjusted independently, or as a group.

The complementary logic circuit 400 does not include ESD protection or latch-up protection resistors 345, but instead can rely on ESD protection provided at a top chip level. Thus, the complementary logic circuit 400 can output substantially either Vdd or Vss. Another effect is that, without the ESD resistors or latch-up protection resistors 345, the entire complementary logic circuit 400 can be scaled down, to reduce the required die area, in a manner that matches the performance characteristics of the p-type transistors 435 and n-type transistors 440.

The first and second inverters 415, 420 are series-coupled between respective conductors in the complementary input 405 and a complementary output 410. The first and second buffers 425 and 430 are cross-coupled between respective conductors in the complementary input 405 and the complementary output 410. This feedforward configuration improves the slew rate, crossing points, and duty-error of the complementary logic circuit 400. The first and second buffers 425 and 430 sense when either conductor of the complementary input 405 starts to change, and subsequently drives both conductors of the complementary output 410 to change their logic value, without waiting for slower p-type transistors in the first and second inverters 415, 420 to affect the complementary output 410. The feedforward configuration of the first and second buffers 425 and 430 also mitigates any phase mismatch in the complementary input 405. The complementary output 410 can be optionally filtered by a pair of capacitors 455, 460.

Figure 5:
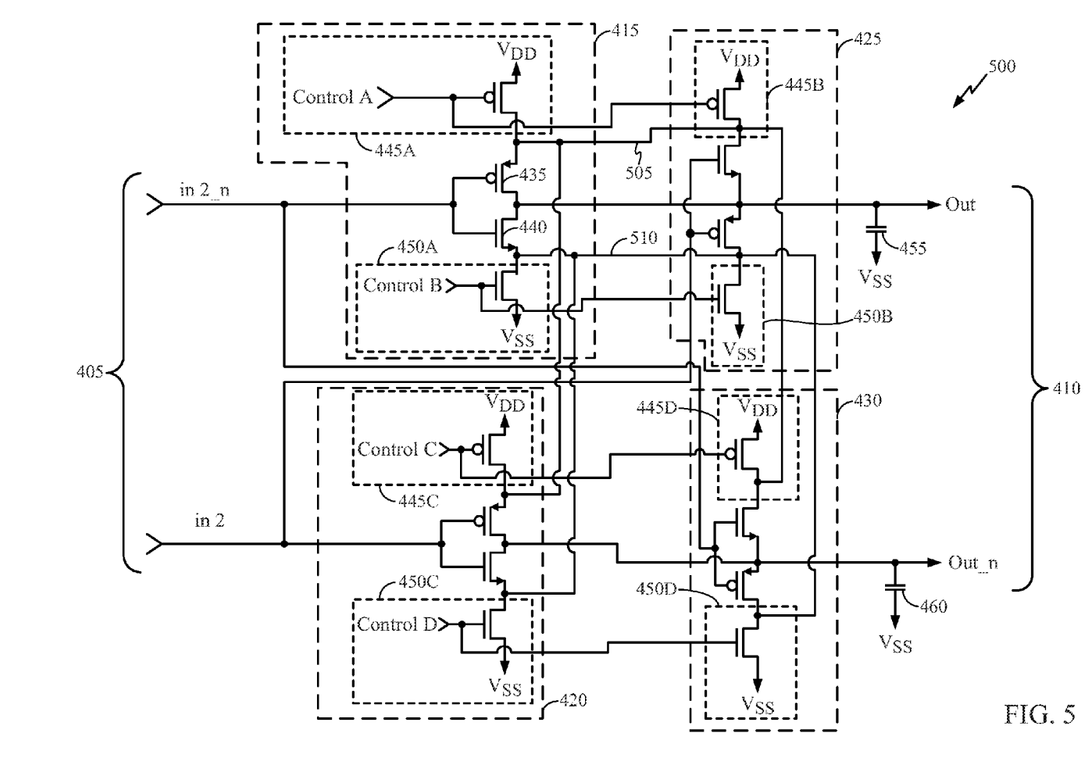
FIG. 5 depicts another exemplary complementary logic circuit having a stacked architecture and common variable power supplies and common variable ground supplies for p-type semiconductors and n-type semiconductors.

FIG. 5 depicts another exemplary complementary logic circuit 500 having a stacked architecture, common variable power supplies, and common variable ground supplies for p-type semiconductors and n-type semiconductors. FIG. 5 shares many of the characteristics of FIG. 4, and adds a common connection 505 for the outputs of at least two of the adjustable positive bias circuits 445A-D in the complementary logic circuit 500, as well as adding a common connection 510 for the outputs of at least two of the adjustable negative bias circuits 450A-D. These common connections 505, 510 mitigate local fabrication variations and improve the slew rate, crossing points, and duty-error of the complementary logic circuit 400, as well as increase tolerance of the complementary logic circuit 500 for voltage variations.

Figure 6:
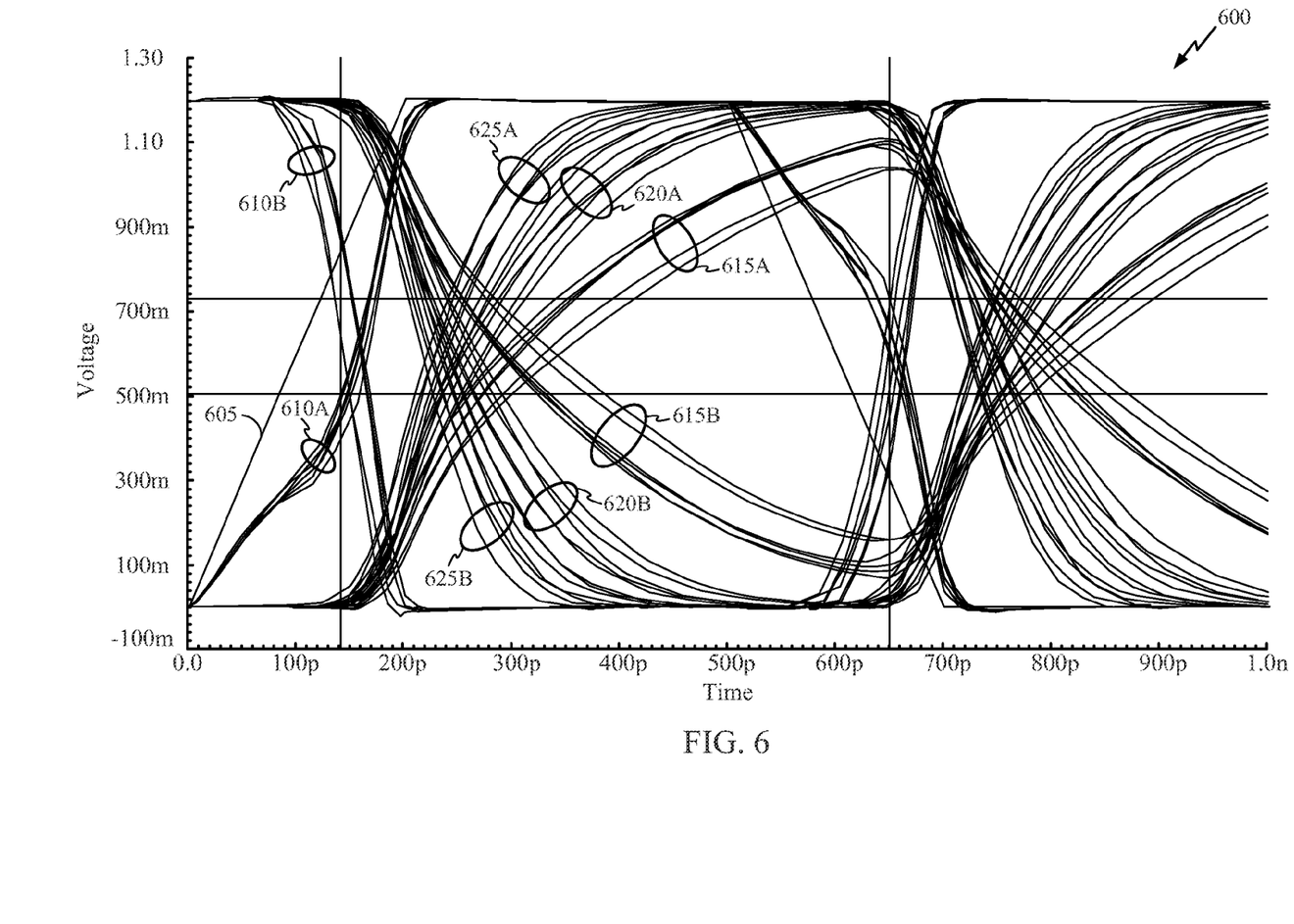
FIG. 6 depicts exemplary input and output waveforms for conventional devices and embodiments described herein.

FIG. 6 depicts a group of exemplary input and output waveforms 600 of the conventional inverter/buffer circuit 200, the conventional complementary logic circuit 300, the complementary logic circuit 400, and the complementary logic circuit 500, for variations in fabrication processes, voltages, temperature, and tolerances. For example, FIG. 6 depicts the effects of temperature varying from −30 C to 125 C, and PMOS transistor switching time varying relative to NMOS transistor switching time. When unmitigated, changes in temperature and process corners can skew output signals, even when the input signals are not skewed. Waveform 605 is one of the simulated unskewed complementary inputs to the conventional inverter/buffer circuit 200. Waveforms 610A-B are the simulated complementary inputs to the conventional complementary logic circuit 300. Waveforms 615A-B are the simulated complementary output of the conventional complementary logic circuit 300. Waveforms 620A-B are the simulated complementary output of the complementary logic circuit 400. Waveforms 625A-B are the simulated complementary output of the complementary logic circuit 500. FIG. 6 shows that the embodiments herein improve crossing points, slew rates, and duty-error over PVT variations when using globally-fast n-type semiconductor devices and globally-slow p-type semiconductor devices, and vice versa.

Figure 7:
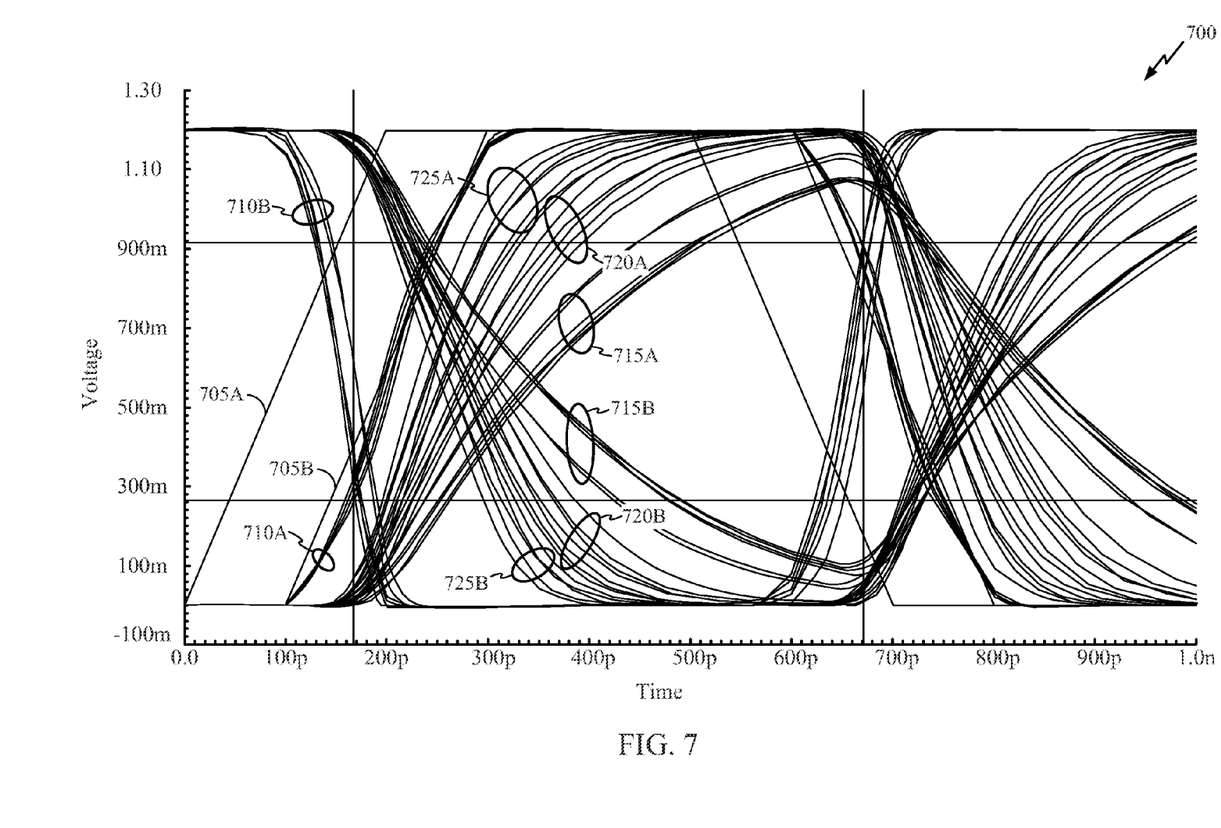
FIG. 7 depicts additional exemplary input and output waveforms for conventional devices and embodiments described herein, in the presence of a timing gap between differential inputs.

FIG. 7 depicts a group of exemplary input and output waveforms 700 of the inverter/buffer circuit 200, the conventional complementary logic circuit 300, the complementary logic circuit 400, and the complementary logic circuit 500, for variations in fabrication processes, voltages, temperature, and tolerances. Waveforms 705A and 705B are the simulated skewed input to the conventional inverter/buffer circuit 200. For an example, input waveform 705B is skewed relative to waveform 705A by 100 picoseconds. Waveforms 710A-B with around 100ps timing skew are the simulated complementary input to the conventional complementary logic circuit 300. Waveforms 715A-B are the simulated complementary output of the conventional complementary logic circuit 300 when the simulated complementary output has a timing gap of 100 picoseconds. Waveforms 720A-B are the simulated complementary output of the complementary logic circuit 400. Waveforms 725A-B are the simulated complementary output of the complementary logic circuit 500. FIG. 7 also shows that outputs must be improved by averaging or phase-mixing an early input with a late input.

Figure 8:
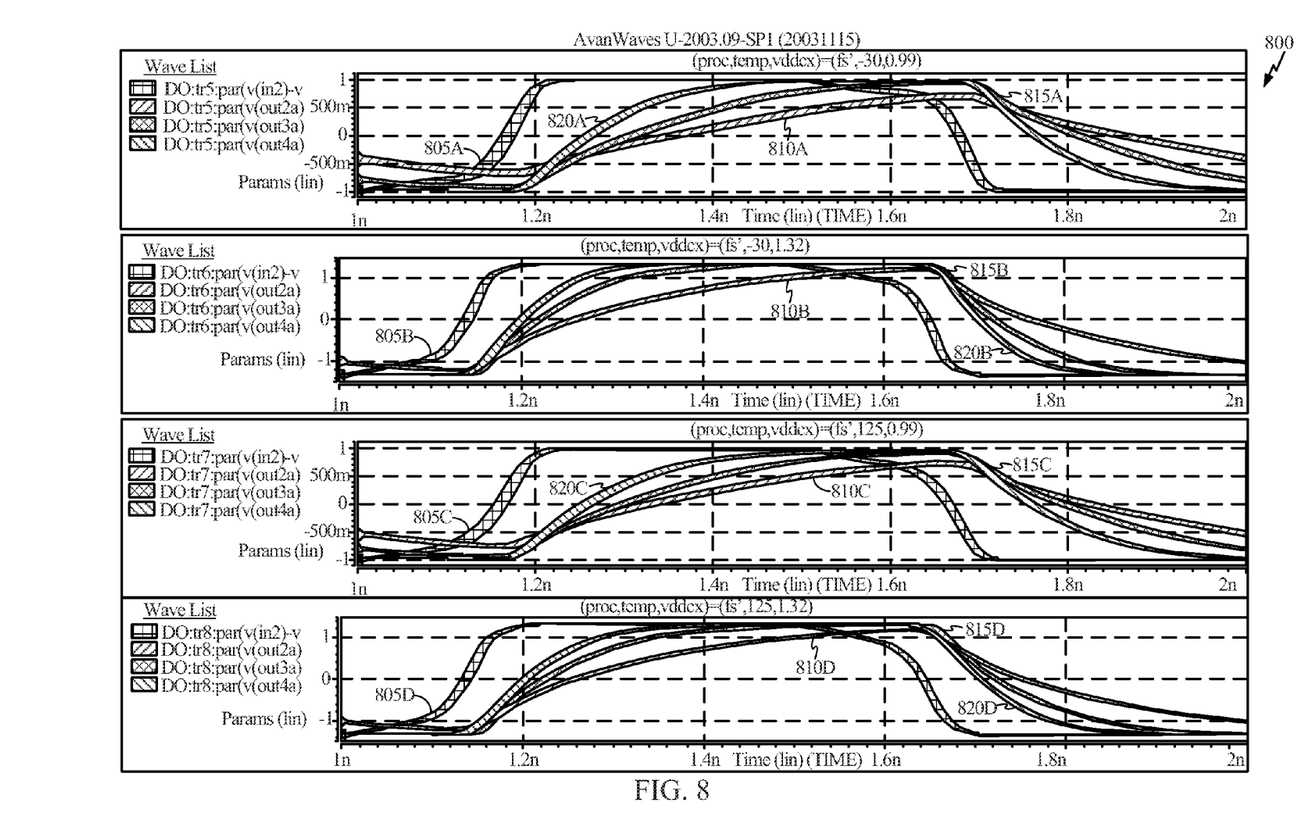
FIG. 8 depicts Monte Carlo simulations of exemplary output waveforms of conventional devices and embodiments described herein.

FIG. 8 depicts a Monte Carlo simulation 800 of exemplary output waveforms of the conventional complementary logic circuit 300, the complementary logic circuit 400, and the complementary logic circuit 500, for variations in fabrication processes, voltages, and tolerances. Waveforms 805A-D and 810A-D are the simulated output of the conventional complementary logic circuit 300. The wide width of waveforms 805A-D illustrates the wide variation of the output of the conventional complementary logic circuit 300 due to local variations in the fabrication process. Waveforms 815A-D are the simulated output of the complementary logic circuit 400. Waveforms 820A-D are the simulated output of the complementary logic circuit 500. The narrow width of waveforms 815A-D and 820A-D, relative to 805A-D, illustrates mitigation of the local variations in the fabrication process.

Figure 9:
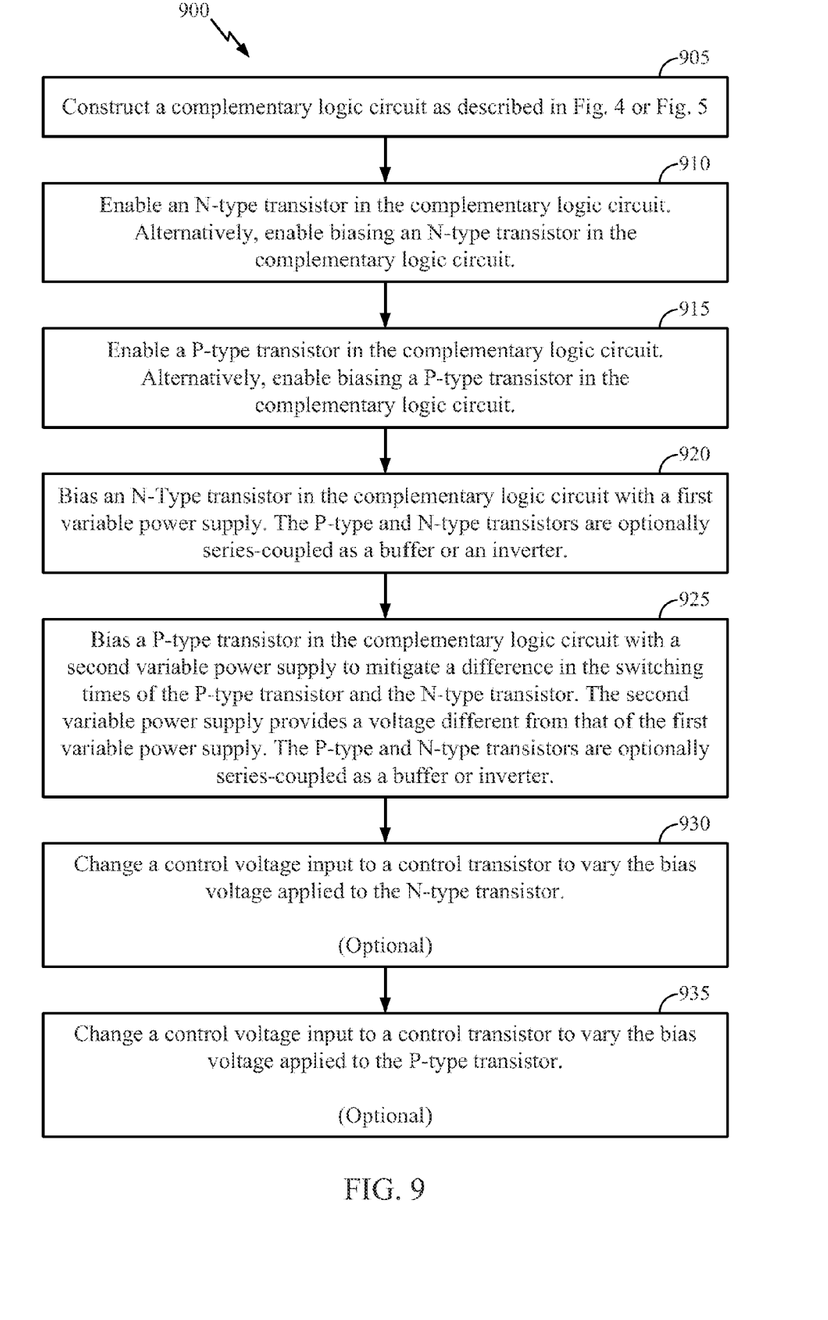
FIG. 9 is a flowchart of a method of improving output slew rates to balance complementary output signals, and to correct both duty cycle and slew rate, in a complementary logic circuit.

FIG. 9 is a flowchart of a method of improving complementary output signals, and self-correcting both duty cycle and slew rate, in a complementary logic circuit 900.

In step 905, the complementary logic circuit as described in FIG. 4 or FIG. 5 is constructed.

In step 910, an n-type transistor in the complementary logic circuit is enabled. Alternatively, biasing an n-type transistor in the complementary logic circuit is enabled.

In step 915, a p-type transistor in the complementary logic circuit is enabled. Alternatively, biasing a p-type transistor in the complementary logic circuit is enabled.

In step 920, an n-type transistor in the complementary logic circuit is biased with a first variable power supply. The p-type and n-type transistors are optionally series-coupled as a buffer or an inverter.

In step 925, a p-type transistor in the complementary logic circuit is biased with a second variable power supply to mitigate a difference in the switching times of the p-type transistor and the n-type transistor. The second variable power supply can provide a voltage different from that of the first variable power supply. The p-type and n-type transistors are optionally series-coupled as a buffer or an inverter.

In step 930, a control voltage input to a control transistor is changed to vary the bias voltage applied to the n-type transistor.

In step 935, a control voltage input to a control transistor is changed to vary the bias voltage applied to the p-type transistor.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described, herein. Accordingly, at least a portion of the devices described herein can be integrated in at least one semiconductor die.

The teachings herein may be incorporated into various types of communication systems and/or system components. In some aspects, the teachings herein may be employed in a multiple-access system capable of supporting communication with multiple users by sharing the available system resources (e.g., by specifying one or more of bandwidth, transmit power, coding, interleaving, and so on). For example, the teachings herein may be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein may be designed to implement one or more standards, such as IS-95, cdma2000, IS-856, W-CDMA, TDSCDMA, and other standards. A CDMA network may implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA and GSM are part of Universal Mobile Telecommunication System (UMTS). The teachings herein may be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure may be described using 3GPP terminology, it is to be understood that the teachings herein may be applied to 3GPP (e.g., Re199, Re15, Re16, Re17) technology, as well as 3GPP2 (e.g., 1xRTT, 1xEV-DO RelO, RevA, RevB) technology and other technologies.

The teachings herein may be integrated into a device, selected from the group consisting of a set top box, music player, video player, entertainment unit, navigation device, communications device, personal digital assistant (PDA), fixed location data unit, and a computer The devices described herein can be coupled to an oscillator, a level-shifting circuit, a memory circuit, and/or a single-ended inverter.

Those of skill in the art will appreciate that information and signals may be represented using any of a variety of different technologies and techniques. For example, data, instructions, commands, information, signals, bits, symbols, and chips that may be referenced throughout the description herein may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described herein generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying at least a part of method for self-correcting errors due to differences in fabrication processes, voltages, and temperature (PVT), as well as timing errors relating to timing skew. Accordingly, the invention is not limited to illustrated examples and any means for performing the functionality described herein are included in embodiments of the invention.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed, there or that the first element must precede the second element in some manner. Also, unless stated otherwise a set of elements may comprise one or more elements. In addition, terminology of the form "at least one of: A, B, or C" used in the description or the claims can mean "A or B or C or any combination of these elements."

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A circuit, comprising:
a first inverter;
a first non-inverting buffer, wherein the first inverter and the first non-inverting buffer have a first common input configured to receive a signal to be buffered by the first non-inverting buffer;
a second inverter;
a second non-inverting buffer, wherein the second inverter and the second non-inverting buffer have a second common input,
wherein the output of the first inverter is coupled to the output of the second non-inverting buffer,
wherein the output of the second inverter is coupled to the output of the first non-inverting buffer; and
a bias network having:
a respective positive bias circuit and a respective negative bias circuit coupled to each inverter; and
a respective positive bias circuit and a respective negative bias circuit coupled to each non-inverting buffer.

2. The circuit of claim 1, wherein the output of each positive bias circuit is commonly coupled.

3. The circuit of claim 1, wherein the output of each negative bias circuit is commonly coupled.

4. The circuit of claim 1, further comprising a capacitor coupled to the output of the first inverter.

5. The circuit of claim 1, further comprising a capacitor coupled to the output of the second inverter.

6. The circuit of claim 1, further comprising a third inverter having an output coupled to the first common input.

7. The circuit of claim 1, further comprising a third non-inverting buffer having an output coupled to the second common input.

8. The circuit of claim 1, further comprising:
a third inverter having an output coupled to the first common input; and
a third non-inverting buffer having an output coupled to the second common input.

9. The circuit of claim 8, wherein the third non-inverting buffer and the third converter have a common input.

10. The circuit of claim 1, further comprising a third inverter and a fourth inverter coupled in parallel between the first and second common inputs.

11. The circuit of claim 1, integrated on at least one semiconductor die.

12. The circuit of claim 1, further comprising a device, selected from the group consisting of a set top box, music player, video player, entertainment unit, navigation device, communications device, personal digital assistant (PDA), fixed location data unit, and a computer, with which the first inverter is integrated.

13. The circuit of claim 1, further comprising a device, selected from the group consisting of an oscillator, a level-shifting circuit, a memory circuit, and a single-ended inverter, to which the first inverter is coupled.

14. The circuit of claim 1, wherein the output of each inverter's positive bias circuit is commonly coupled.

15. The circuit of claim 1, wherein the output of each inverter's negative bias circuit is commonly coupled.

16. The circuit of claim 1, wherein the output of each non-inverting buffer's positive bias circuit is commonly coupled.

17. The circuit of claim 1, wherein the output of each non-inverting buffer's negative bias circuit is commonly coupled.

18. The circuit of claim 1, wherein the positive bias circuits have a common control input.

19. The circuit of claim 1, wherein the negative bias circuits have a common control input.

20. A method for improving output signals in a complementary logic circuit, comprising:
biasing an n-type transistor in the complementary logic circuit with a first variable power supply; and
biasing a p-type transistor in the complementary logic circuit with a second variable power supply to mitigate a difference in the switching times of the p-type transistor and the n-type transistor,
wherein the second variable power supply provides a voltage different from that of the first variable power supply.

21. The method of claim 20, wherein the p-type and n-type transistors are series-coupled as a non-inverting buffer.

22. The method of claim 20, wherein the p-type and n-type transistors are series-coupled as an inverter.

23. The method of claim 20, further comprising changing a control voltage input to a control transistor to vary the bias voltage applied to the n-type transistor.

24. The method of claim 20, further comprising changing a control voltage input to a control transistor to vary the bias voltage applied to the p-type transistor.

25. The method of claim 20, further comprising enabling biasing of the n-type transistor.

26. The method of claim 20, further comprising enabling biasing of the p-type transistor.

27. A circuit, comprising:
means for biasing an n-type transistor in the complementary logic circuit with a first variable power supply; and
means for biasing a p-type transistor in the complementary logic circuit with a second variable power supply to mitigate a difference in the switching times of the p-type transistor and the n-type transistor,
wherein the second variable power supply provides a voltage different from that of the first variable power supply.

28. The circuit of claim 27, wherein the p-type and n-type transistors are series-coupled as a non-inverting buffer.

29. The circuit of claim 27, wherein the p-type and n-type transistors are series-coupled as an inverter.

30. The circuit of claim 27, further comprising means for varying a control voltage input to a control transistor to vary the bias voltage applied to the n-type transistor.

31. The circuit of claim 27, further comprising means for varying a control voltage input to a control transistor to vary the bias voltage applied to the p-type transistor.

32. The circuit of claim 27, further comprising means for enabling biasing of the n-type transistor.

33. The circuit of claim 27, further comprising means for enabling biasing of the p-type transistor.

34. A non-transitory computer-readable medium, comprising instructions stored thereon that, if executed by a lithographic device, cause the lithographic device to fabricate at least a part of an integrated circuit, comprising:
   a first inverter;
   a first non-inverting buffer, wherein the first inverter and the first non-inverting buffer have a first common input configured to receive a signal to be buffered by the first non-inverting buffer;
   a second inverter;
   a second non-inverting buffer, wherein the second inverter and the second non-inverting buffer have a second common input,
   wherein the output of the first inverter is coupled to the output of the second non-inverting buffer,
   wherein the output of the second inverter is coupled to the output of the first non-inverting buffer; and
   a bias network having:
      a respective positive bias circuit and a respective negative bias circuit coupled to each inverter; and
      a respective positive bias circuit and a respective negative bias circuit coupled to each non-inverting buffer.

35. The circuit of claim 27, further comprising a device, selected from the group consisting of a set top box, music player, video player, entertainment unit, navigation device, communications device, personal digital assistant (PDA), fixed location data unit, and a computer, with which the means for biasing the n-type transistor is integrated.

36. The circuit of claim 27, further comprising a device, selected from the group consisting of an oscillator, a level-shifting circuit, a memory circuit, and a single-ended inverter, to which the means for biasing the n-type transistor is coupled.

* * * * *